(12) United States Patent
Fujiwara et al.

(10) Patent No.: US 9,637,598 B2
(45) Date of Patent: May 2, 2017

(54) METHOD OF CURING THERMOSETTING RESIN COMPOSITION, THERMOSETTING RESIN COMPOSITION, AND PREPREG, METAL-CLAD LAMINATE, RESIN SHEET, PRINTED-WIRING BOARD, AND SEALING MATERIAL IN WHICH THERMOSETTING RESIN COMPOSITION IS USED

(71) Applicant: Panasonic Intellectual Property Management Co., Ltd., Osaka (JP)

(72) Inventors: Hiroaki Fujiwara, Fukushima (JP); Yuki Kitai, Osaka (JP); Hirosuke Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/766,433

(22) PCT Filed: Feb. 3, 2014

(86) PCT No.: PCT/JP2014/000549
§ 371 (c)(1),
(2) Date: Aug. 6, 2015

(87) PCT Pub. No.: WO2014/122911
PCT Pub. Date: Aug. 14, 2014

(65) Prior Publication Data
US 2015/0376338 A1 Dec. 31, 2015

(30) Foreign Application Priority Data

Feb. 8, 2013 (JP) ................. 2013-023572

(51) Int. Cl.
| | | |
|---|---|---|
| C08L 61/04 | (2006.01) |
| C08G 73/22 | (2006.01) |
| C08J 5/24 | (2006.01) |
| H01L 23/29 | (2006.01) |
| H01L 23/14 | (2006.01) |
| C08G 73/02 | (2006.01) |
| C08K 5/378 | (2006.01) |
| C08L 79/04 | (2006.01) |
| H05K 1/03 | (2006.01) |
| B32B 15/14 | (2006.01) |
| C08L 63/00 | (2006.01) |
| C08G 14/06 | (2006.01) |
| C08L 61/34 | (2006.01) |
| B32B 15/08 | (2006.01) |
| B32B 15/092 | (2006.01) |
| B32B 27/04 | (2006.01) |

(52) U.S. Cl.
CPC ............. *C08G 73/22* (2013.01); *B32B 15/14* (2013.01); *C08G 14/06* (2013.01); *C08G 73/0233* (2013.01); *C08J 5/24* (2013.01); *C08K 5/378* (2013.01); *C08L 61/04* (2013.01); *C08L 61/34* (2013.01); *C08L 63/00* (2013.01); *C08L 79/04* (2013.01); *H01L 23/145* (2013.01); *H01L 23/295* (2013.01); *H05K 1/0326* (2013.01); *H05K 1/0346* (2013.01); *B32B 2260/021* (2013.01); *B32B 2260/046* (2013.01); *B32B 2305/076* (2013.01); *B32B 2307/206* (2013.01); *B32B 2307/306* (2013.01); *B32B 2307/3065* (2013.01); *B32B 2457/00* (2013.01); *B32B 2457/08* (2013.01); *B32B 2581/00* (2013.01); *C08J 2379/04* (2013.01); *H01L 2924/0002* (2013.01); *H05K 1/0366* (2013.01)

(58) Field of Classification Search
None
See application file for complete search history.

(56) References Cited

U.S. PATENT DOCUMENTS

| | | | |
|---|---|---|---|
| 2004/0076805 A1 | 4/2004 | Oohori et al. | |
| 2006/0008632 A1 | 1/2006 | Oohori et al. | |
| 2010/0210492 A1 | 8/2010 | Lange et al. | |
| 2011/0081613 A1 | 4/2011 | Takeda et al. | |
| 2013/0081864 A1* | 4/2013 | Norikoshi | G03F 7/0047 174/258 |
| 2013/0130956 A1 | 5/2013 | Lange et al. | |
| 2014/0024568 A1 | 1/2014 | Lange et al. | |

FOREIGN PATENT DOCUMENTS

| | | |
|---|---|---|
| JP | 2008-274274 A | 11/2008 |
| JP | 2009-167251 A | 7/2009 |
| JP | 2009-167252 A | 7/2009 |
| JP | 2009-222923 A | 10/2009 |
| JP | 2010-070757 A | 4/2010 |
| JP | 2010-533752 A | 10/2010 |
| JP | 2011-198844 A | 10/2011 |
| JP | 2012-153755 A | 8/2012 |
| WO | 2009/010441 A2 | 1/2009 |

OTHER PUBLICATIONS

International Search Report and Written Opinion issued in corresponding International Patent Application No. PCT/JP2014/000549; 14 pages with English translation.

* cited by examiner

*Primary Examiner* — Robert Sellers
(74) *Attorney, Agent, or Firm* — McDermott Will & Emery LLP

(57) ABSTRACT

A method of curing a thermosetting resin composition according to the present invention includes mixing a thermosetting resin containing a benzoxazine compound and a curing accelerator containing a triazine thiol compound to prepare a thermosetting resin composition, and heating this thermosetting resin composition to be cured.

7 Claims, No Drawings

METHOD OF CURING THERMOSETTING RESIN COMPOSITION, THERMOSETTING RESIN COMPOSITION, AND PREPREG, METAL-CLAD LAMINATE, RESIN SHEET, PRINTED-WIRING BOARD, AND SEALING MATERIAL IN WHICH THERMOSETTING RESIN COMPOSITION IS USED

RELATED APPLICATIONS

This application is the U.S. National Phase under 35 U.S.C. §371 of International Patent Application No. PCT/JP2014/000549, filed on Feb. 3, 2014, which in turn claims the benefit of Japanese Application No. 2013-023572, filed on Feb. 8, 2013, the disclosures of which Applications are incorporated by reference herein.

TECHNICAL FIELD

The present invention relates to a method of curing a thermosetting resin composition, a thermosetting resin composition, and a prepreg, a metal-clad laminate, a resin sheet, a printed-wiring board, and a sealing material in which the thermosetting resin composition is used, and particularly relates to a method of curing a thermosetting resin composition that is suitable for an insulating material for a prepreg, a laminate, a resin sheet, a printed-wiring board, and the like, and a sealing material for sealing a semiconductor or the like.

BACKGROUND ART

Conventionally, various types of thermosetting resin compositions have been used for insulating materials for printed-wiring boards and the like, and sealing materials for sealing semiconductors and the like. There is a demand for these thermosetting resin compositions to be excellent in the performance of electrical properties, heat resistance, and flame-retardancy, along with an improvement in the performance of various types of electronics and a diversification of applications.

In such a background, in order to improve properties of the thermosetting resin compositions, it has been proposed that a benzoxazine compound that has excellent electrical properties and heat resistance and is useful for provision of flame-retardancy is mixed into the thermosetting resin compositions as a resin component (see Patent Document 1, for example). It has been known that this benzoxazine compound is cured along with ring-opening polymerization of an oxazine ring in a process in which the thermosetting resin composition is hot molded. However, the benzoxazine compound has a slower cure rate compared to other thermosetting resins such as an epoxy resin and imide resin, and thus there is a problem in that if the benzoxazine compound is used as the component of the thermosetting resin, the benzoxazine compound is not sufficiently cured under hot molding conditions under which laminates or sealing materials are generally molded, and it is difficult for a cured material to have high heat resistance and a high glass transition point.

Also, it is possible to increase the degree of cure of the benzoxazine compound, improve the heat resistance of the cured material, and increase the glass transition point of the cured material through extending a molding time period or raising a molding temperature during hot molding. However, in that case, productivity decreases and manufacturing costs increase, and it is difficult to control resin fluidity and the like during molding, as a result of which molding properties may deteriorate. Thus, there is an issue in that the degree of freedom of designing hot molding conditions decreases.

Also, it has been conventionally proposed that a benzoxazine compound is mixed along with a phosphorus-containing compound into a thermosetting resin such as an epoxy resin or imide resin to prepare the thermosetting resin composition in order to become halogen-free and flame-retardant. However, if the content of the benzoxazine compound is increased, the cure rate of the resin decreases, and thus there is a concern that the above-described various issues may arise. On the other hand, if the content of the benzoxazine compound is reduced, there is an issue in that the properties of the benzoxazine compound are deteriorated.

In view of this, a phenol compound is used as the resin component in combination with the benzoxazine compound in order to accelerate curing of the benzoxazine compound, but the fact is that undercuring of the benzoxazine compound has not been sufficiently addressed.

CITATION LIST

Patent Literature

Patent Document 1: JP 2008-274274A

SUMMARY OF INVENTION

Technical Problem

The present invention has been made in view of the above-described issues, and an object thereof is to provide a method of curing a thermosetting resin composition that can improve the cure rate of a resin composition containing a benzoxazine compound, a thermosetting resin composition, and a prepreg, a metal-clad laminate, and a sealing material in which the thermosetting resin composition is used.

Solution to Problem

In view of circumstances of the conventional techniques described above, as a result of the earnest study of an effective method for accelerating a curing reaction of the benzoxazine compound through trial and error, the inventors found that the curing reaction of the benzoxazine compound could be significantly improved through using a specific compound as a curing accelerator, and could accomplish the present invention.

A method of curing a thermosetting resin composition according to the present invention includes mixing a thermosetting resin containing a benzoxazine compound and a curing accelerator containing a triazine thiol compound to prepare a thermosetting resin composition, and heating the thermosetting resin composition to be cured.

It is preferable that the thermosetting resin composition be heated to 50° C. or more to be cured.

It is preferable that the triazine thiol compound include a compound having three or more thiol groups in one molecule.

It is also preferable that the triazine thiol compound include a compound having a triazine ring and a thiol group directly bound to the triazine ring.

It is also preferable that the triazine thiol compound include a compound having a triazine ring and three or more thiol groups directly bound to the triazine ring.

It is preferable that a percentage of the triazine thiol compound to the entirety of the thermosetting resin composition be within a range of 0.1 to 30% by mass.

It is preferable that the curing accelerator further include imidazole.

It is preferable that the thermosetting resin further include an epoxy resin.

A thermosetting resin composition according to the present invention includes a thermosetting resin containing a benzoxazine compound and a curing accelerator containing a triazine thiol compound.

It is preferable that a gel time of the thermosetting resin composition according to the present invention at 200° C. be 7 minutes or less.

A prepreg according to the present invention is obtained through impregnating a fiber base material with the thermosetting resin composition, and semi-curing the thermosetting resin composition.

A metal-clad laminate according to the present invention is obtained through laminating the prepreg with a metal foil, and hot-press molding the laminated prepreg.

A resin sheet according to the present invention is obtained through applying the thermosetting resin composition onto a carrier sheet.

A printed-wiring board according to the present invention includes an insulating layer made of a cured material of the thermosetting resin composition.

A sealing material according to the present invention is made of the thermosetting resin composition.

Advantageous Effects of Invention

According to a method of curing a thermosetting resin composition according to the present invention, it is possible to improve the cure rate of a benzoxazine compound through using a curing accelerator containing a triazine thiol compound.

DESCRIPTION OF EMBODIMENTS

Hereinafter, an embodiment of the present invention will be described.

A method of curing a thermosetting resin composition according to this embodiment includes mixing a thermosetting resin containing a benzoxazine compound and a curing accelerator containing a triazine thiol compound to prepare a thermosetting resin composition, and heating the thermosetting resin composition to be cured.

There is no particular limitation on the benzoxazine compound as long as the benzoxazine compound has a benzoxazine ring in the molecule, and from the point of view of obtaining good reactivity and cross-link density in the cured material, it is preferable that the benzoxazine compound include a compound having two or more benzoxazine rings in one molecule. Specific examples of the compound included in the benzoxazine compound include: Fa-based benzoxazine compounds obtained through a reaction between a bisphenol compound and an amine compound (for example, aniline), such as a bisphenol A-based benzoxazine compound or a bisphenol F-based benzoxazine compound; and a Pd-based benzoxazine compound obtained through a reaction between a phenyldiamine compound and a phenol compound, such as a diaminodiphenylmethane-based benzoxazine compound. Benzoxazine compounds that are available as commercial products can be used. For example, a bisphenol F-based benzoxazine compound, which is an Fa-based benzoxazine compound, has a structure as represented by Formula (1) below.

[Formula 1]

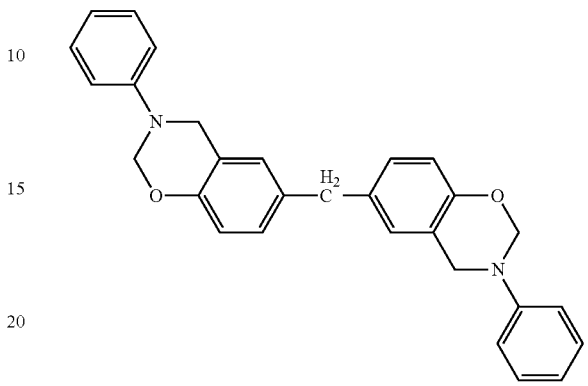

The thermosetting resin includes the benzoxazine compound as an essential component, and may include a thermosetting compound other than the benzoxazine compound. There is no particular limitation on the thermosetting compound other than the benzoxazine compound as long as it does not inhibit the curing reaction of the benzoxazine compound, and examples thereof include epoxy resins, phenol resins, cyanate resins, isocyanate resins, unsaturated imide resins, amino resins, unsaturated polyester resins, allyl resins, dicyclopentadiene resins, silicone resins, melamine resins, and the like. Among these resins, epoxy resins and phenol resins are preferable as examples of resins that exhibit a good curing reaction in combination with the benzoxazine compound. These thermosetting resins may be used alone or in combination. Note that examples of the thermosetting compound that is to be mixed into the thermosetting resin include a compound that functions as a so-called curing agent (cross-linking agent) for the benzoxazine compound and another resin component that is used in combination as a base resin.

If the thermosetting resin includes the benzoxazine compound and an epoxy resin, there is no particular limitation on the epoxy compounds that can be used, and examples thereof include bisphenol type epoxy resins, novolac type epoxy resins, alicyclic epoxy resins, glycidyl esters, glycidyl amines, heterocyclic epoxy resins, brominated epoxy resins, and the like. Examples of the bisphenol type epoxy resins above include bisphenol A epoxy resins, bisphenol F epoxy resins, bisphenol S epoxy resins, and the like. Examples of the novolac type epoxy resins above include phenol novolac epoxy resins, cresol novolac epoxy resins, bisphenol A-novolac epoxy resins, dicyclopentadiene novolac epoxy resins, and the like. Examples of the alicyclic epoxy resins above include 3,4-epoxy-6-methylcyclohexylmethyl-3,4-epoxy-6-methylcyclohexane carboxylate, 3,4-epoxycyclohexylmethyl-3,4-epoxycyclohexane carboxylate, 1-epoxyethyl-3,4-epoxycyclohexane, and the like. Examples of the glycidyl esters above include phthalic acid diglycidyl ester, tetrahydrophthalic acid diglycidyl ester, dimer acid glycidyl ester, and the like. Examples of the glycidyl amines above include tetraglycidyl diaminodiphenylmethane, triglycidyl P-aminophenol, N,N-diglycidylaniline, and the like. Examples of the heterocyclic epoxy resins above include 1,3-diglycidyl-5,5- dimethylhydatoin triglycidylisocyanurate, and the like. Also, examples of the brominated epoxy resins include tetrabromobisphenol A epoxy resins, tetrabromobisphenol F epoxy resins, brominated cresol novolac epoxy resins, brominated phenol novolac epoxy resins, and the like. These epoxy resins may be used alone or in combination.

There is no particular limitation on the triazine thiol compound included in the curing accelerator as long as it is a compound having a triazine ring and a thiol group (—SH) in the molecule, and the triazine thiol compound preferably includes a compound having three or more thiol groups in one molecule. In this case, it is possible to further increase the cure rate of the benzoxazine compound.

Also, it is preferable that the triazine thiol compound include a compound in which a thiol group is directly bound to a triazine ring, or in other words, a compound having a triazine ring and a thiol group directly bound to the triazine ring. In this case, it is possible to further increase the cure rate of the benzoxazine compound. It is conceivable that the reasons for this are as follows. The thiol group has small activation energy to generate active hydrogen, and therefore the thiol group has an excellent effect of accelerating the ring-opening polymerization of benzoxazine. Thus, if benzoxazine is opened, a phenol group generated from benzoxazine serves as an acid catalyst, further accelerating the ring-opening polymerization of benzoxazine.

It is also preferable that the triazine thiol compound include a compound having a triazine ring and three or more thiol groups directly bound to the triazine ring.

Specific examples of the compound that can be included in the triazine thiol compound include 2,4,6-trimercapto-s-triazine, which is represented by Formula (2) below.

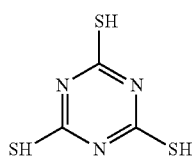

[Formula 2]

It is preferable that the percentage of the triazine thiol compound to the entirety of the thermosetting resin composition be within a range of 0.1 to 30% by mass. Note that if the thermosetting resin composition contains an inorganic material such as an inorganic filler, the inorganic material is excluded from "the entirety of the thermosetting resin composition". Also, if the thermosetting resin composition contains solvent, the solvent is excluded from "the entirety of the thermosetting resin composition". If the percentage of the triazine thiol compound is 0.1% by mass or more, it is possible to obtain a good curing acceleration effect of the benzoxazine compound. If the percentage of the triazine thiol compound is 30% by mass or less, it is possible to obtain a necessary and sufficient curing acceleration effect of the benzoxazine compound, and to prevent any deterioration in other properties (deterioration in electrical properties, increase in metal corrosiveness, and the like), which may be caused by an excess amount of thiol groups. The percentage of triazine thiol compound is further desirably within a range of 0.5 to 15% by mass, and more optimally within a range of 1 to 10% by mass.

The curing accelerator may also include another compound for cure acceleration other than the triazine thiol compound. There is no particular limitation on the another compound for cure acceleration as long as it can accelerate the curing reaction of the benzoxazine compound, and examples thereof include imidazole-based compounds, organic phosphine-based compounds, and tertiary amine-based compounds. These compounds may be used alone or in combination. Among these compounds, the imidazole-based compound is preferably mixed into the curing accelerator. In this case, the cure rate of the benzoxazine compound can be further increased by good synergistic effects resulting from the combination of the triazine thiol compound and the imidazole-based compound.

Specific examples of the imidazole-based compounds include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, and 1-aminomethyl-2-methylimidazole. It is preferable that the percentage of the imidazole-based compound to the entirety of the thermosetting resin composition be within a range of 0.1 to 1% by mass.

The thermosetting resin composition may further contain another component as required. Examples of the another component include an inorganic filler, a flame retardant, and an additive agent.

Known inorganic filler may be used to improve the heat resistance, flame-retardancy, and heat conductivity of a cured material of the thermosetting resin composition, and decrease the expansion coefficient thereof. Specific examples of the inorganic fillers include silica, alumina, talc, aluminum hydroxide, magnesium hydroxide, titanium oxide, mica, aluminum borate, barium sulfate, and calcium carbonate. These inorganic fillers may be used alone or in combination. Also, a surface treatment may be performed on the inorganic filler with an epoxy silane coupling agent or an amino silane coupling agent, and alternatively such a surface treatment may not be performed thereon.

Examples of the flame retardants include phosphorus-based flame retardants and halogen-based flame retardants. Specific examples of the phosphorus-based flame retardants include phosphate esters such as condensed phosphate esters and cyclic phosphate esters; phosphazene compounds such as cyclic phosphazene compounds; and phosphinate-based flame retardants such as metal phosphinates like aluminum dialkylphosphinate. Also, examples of the halogen-based flame retardants include bromine-based flame retardants. Also, from the point of view of halogen free, the phosphorus-based flame retardant is preferably used. The flame retardants that are described above as examples may be used alone or in combination.

Examples of the additive agents include antifoaming agents such as silicone-based antifoaming agents and acrylic ester-based antifoaming agents; heat stabilizers; antistatic agents; ultraviolet absorbing agents; coloring agents such as dyes and pigments; lubricants; and dispersing agents such as wetting and dispersing agents. These additive agents may be used alone or in combination.

The thermosetting resin composition is prepared through blending the thermosetting resin, curing accelerator, and any other component as required. Specifically, the thermosetting resin composition is prepared as follows, for example.

First, components such as the benzoxazine compound that can be dissolved in an organic solvent are introduced into an organic solvent and dissolved to prepare a mixture. At this time, the mixture may be heated as required. Thereafter, components that are used as required and not dissolved in the organic solvent, such as the inorganic filler, are added to the mixture, and then the components that are not dissolved in the organic solvent are dispersed in the mixture using a ball mill, bead mill, roll mill, or the like until they are in a predetermined dispersion state, as a result of which the thermosetting resin composition is prepared. There is no particular limitation on the organic solvent used here as long as it can dissolve the benzoxazine compound and the like and does not inhibit the curing reaction. Specific examples of the organic solvents include methyl ethyl ketone, acetone, toluene, N,N-dimethylformamide, propylene glycol monomethyl ether acetate, 1-methoxy-2-propanol, and THF.

In order to cure a thermosetting resin composition according to this embodiment, the thermosetting resin composition can be heated to equal to or greater than a temperature at which the curing reaction of the benzoxazine compound is substantially started. For example, it is sufficient that the thermosetting resin composition be heated at a temperature of 50° C. or more to be cured, and the thermosetting resin composition is preferably heated at a temperature within a range of 130° C. to 250° C. to be cured. Note that there is no particular limitation on a specific temperature condition under which the thermosetting resin composition is cured, and the temperature condition can be appropriately set in accordance with applications of use or purposes of the thermosetting resin composition.

Although the degree of progress in the curing reaction of the thermosetting resin composition according to the present embodiment can be measured by various methods, it can be measured through measuring a gel time, as a simple method. The above-described thermosetting resin, curing accelerator, and any other components as required are blended to prepare a thermosetting resin composition, the thermosetting resin composition is placed on a heating platen heated to a predetermined temperature, and then the gel time is measured while the thermosetting resin composition is being stirred on the heating platen. A time period is measured from when the thermosetting resin composition is placed on the heating platen to when the thermosetting resin composition is gelated (solidified) after undergoing a molten state on the heating platen, and then the measured time period is referred to as the "gel time". Specifically, the gel time is preferably measured conforming to a measurement method defined by JIS C 6521. Even though the thermosetting resin composition according to the present embodiment contains the benzoxazine compound having a relatively slow cure rate, the thermosetting resin composition also contains the curing accelerator containing the triazine thiol compound, and thus the cure rate of the benzoxazine compound is increased. Thus, it is possible to obtain a preferred gel time for the case where the thermosetting resin composition is hot molded for applications in various fields. For example, it is possible to design blending of the components of the thermosetting resin composition such that the gel time of the thermosetting resin composition at 200° C. is 7 minutes or less, and preferably not less than 10 seconds and not more than 5 minutes. Therefore, the thermosetting resin composition is particularly useful for applications involving hot molding of a resin material, which will be described later.

Next, applications of use to which the thermosetting resin composition is applicable will be described below. There is no particular limitation on the applications of use of the thermosetting resin composition as long as the properties of the thermosetting resin composition can be utilized, and the thermosetting resin composition is particularly useful for being applied to electronic materials, for example. Specifically, the thermosetting resin composition can be used as insulating materials for metal-clad laminates or printed-wiring boards, sealing materials used for sealing electronic components such as semiconductor components, other molding materials in the applications that require insulation properties or high heat resistance, and the like.

If the thermosetting resin composition is used as an insulating material for metal-clad laminates or printed-wiring boards, the thermosetting resin composition can be applied as a form of; a prepreg in which a fiber base material is impregnated with the composition; a resin sheet in which the composition is applied onto a carrier sheet such as a metal foil or a resin film; and the like. In other words, the prepreg can be obtained through impregnating the fiber base material with the thermosetting resin composition. Also, the resin sheet can also be obtained through applying the thermosetting resin composition onto the carrier sheet such as a metal foil or a resin film.

A method of manufacturing a prepreg using the thermosetting resin composition will be described below. The prepreg can be manufactured through impregnating a fiber base material such as glass cloth with the thermosetting resin composition, and drying the impregnated thermosetting resin composition to be semi-cured. At that time, in order to impregnate the fiber base material with the thermosetting resin composition, the thermosetting resin composition is prepared as a resin varnish containing an organic solvent, for example. In other words, components of the thermosetting resin composition are mixed in the organic solvent, and the thermosetting resin composition is dissolved and dispersed therein to prepare a resin varnish in a liquid state. There is no particular limitation on the organic solvent used here as long as it dissolves resin components such as the benzoxazine compound and does not inhibit the curing reaction. Specific examples of the organic solvent include methyl ethyl ketone, acetone, toluene, N,N-dimethylformamide, and propylene glycol monomethyl ether acetate.

The fiber base material such as glass cloth is impregnated with the resin varnish obtained in this manner, the impregnated fiber base material is heated and dried, and then the solvent is removed by volatilization and the thermosetting resin composition is semi-cured, as a result of which a prepreg can be obtained. Examples of the fiber base material include glass cloth, polyester cloth, glass nonwoven fabric, aramid nonwoven fabric, pulp paper, and the like. Also, the fiber base material is impregnated with the resin varnish using an immersion method, an application method, or the like. This impregnation may be repeated several times as required. The fiber base material impregnated with the resin varnish may be heated and dried under a desired heating condition, for example, at 80 to 170° C. for 1 to 10 minutes, such that the curing reaction of the thermosetting resin composition has not excessively progressed.

A method of producing a metal-clad laminate using the prepreg obtained in this manner will be described. A metal foil is placed on both of upper and lower sides, or any one of the upper and lower sides of the prepreg. One prepreg may be placed thereon, and alternatively a plurality of prepregs may be laminated. These are hot-press molded to produce an integrated laminate. Accordingly, a metal-clad laminate (double-sided metal-clad laminate or one-side metal-clad laminate) can be obtained. Examples of the metal foil include copper foil, silver foil, aluminum foil, stainless steel foil, and the like. There is no particular limitation on hot-press conditions, and the hot-press conditions may be appropriately set in accordance with the thickness of a metal-clad laminate to be manufactured, content of components of the resin composition of a prepreg, and the like, and a general exemplary condition may be set at a temperature of 150 to 250° C., a pressure of 1.5 to 4.0 MPa, a time of 60 to 150 minutes.

A treatment such as etching is performed on the metal-clad laminate obtained as described above to partially remove a metal layer (metal foil) from the surface thereof, and thus a desired patterned circuit is formed, as a result of which a printed-wiring board including an insulating layer and the circuit placed on the surface thereof can be obtained.

Also, this printed-wiring board is used as a base substrate, and a second prepreg and a second metal foil are further laminated on the surface of the base substrate and the laminated printed-wiring board is hot-press molded, as a result of which a multilayer printed-wiring board can also be obtained.

Next, a method of manufacturing a resin sheet using the thermosetting resin composition will be described below. For example, the resin sheet can be obtained through applying the thermosetting resin composition onto a carrier sheet such as a metal foil or a resin film. This thermosetting resin composition is prepared as a resin varnish, similarly to the above-described case where the prepreg is manufactured, for example. There is no particular limitation on the method of applying the thermosetting resin composition thereon, and examples of the method include various types of known methods such as spin coating, dip coating, flow coating, spray coating, roll coating, and bar coater methods. The thermosetting resin composition is applied to form a coating film, and then the coating film is heated and dried, as a result of which a resin sheet made of the thermosetting resin composition can be obtained.

A method of producing a printed-wiring board using the resin sheet obtained in this manner will be described below. A base substrate including an insulating layer and metal layers or circuits placed on both sides of the insulating layer is prepared. The resin sheet supported by the carrier sheet is placed on each of both sides of the base substrate, and then the resin sheet is heated to be cured, as a result of which a second insulating layer made of a cured material of the thermosetting resin composition is formed on each of both sides of the base substrate. At this time, similarly to the above-described case where the metal-clad laminate is produced, a heating temperature is within a range of 80 to 170° C., for example. Furthermore, a second circuit is formed on the surface of the second insulating layer formed on the base substrate. If the carrier sheet is a metal foil such as copper foil, the second circuit can be formed through performing etching or the like on the metal foil. Also, if the carrier sheet is a resin film such as PET, this resin film is peeled from the second insulating layer, and then a plating treatment or the like is performed on the exposed second insulating layer, as a result of which the second circuit can be formed. A multilayer can be formed through repeating the formation of the second insulating layer and the formation of the second circuit as required. In this manner, a multilayer printed-wiring board can be produced.

Next, a method of manufacturing a sealing material made of the thermosetting resin composition will be described. The sealing material is produced as follows, for example.

First, components for the thermosetting resin composition are blended, and these components are evenly mixed using a mixer or the like to prepare a mixture. Thereafter, the mixture is further melted, mixed, and kneaded using a heat roll, kneader, or the like to obtain the sealing material. The sealing material may be hot molded under a high temperature condition. Examples of a hot molding method include low pressure transfer molding and injection molding. Electronic components such as semiconductor elements mounted on a substrate are sealed with this sealing material, for example.

As described above, the thermosetting resin composition according to the present embodiment contains a curing accelerator containing a triazine thiol compound, and thereby the cure rate of the benzoxazine compound can be increased. Thus, it is possible to shorten a curing time for the case where the prepreg, resin sheet, and sealing material obtained using the thermosetting resin composition are each hot molded to be cured, and the thermosetting resin composition increases the productivity in the case where a metal-clad laminate, a printed-wiring board, or the like is manufactured using them.

Also, although the thermosetting resin composition according to the present embodiment contains the benzoxazine compound as a thermosetting resin, it is possible to resolve undercuring of the benzoxazine compound in a cured material of the thermosetting resin composition. Accordingly, the thermosetting resin composition can be provided as an insulating material that can suitably exhibit excellent properties of the cured material of the benzoxazine compound (for example, electrical insulating properties, heat resistance, and flame-retardancy). Thus, a prepreg, a metal-clad laminate in which this prepreg is used, a resin sheet, a printed-wiring board, and a sealing material that are obtained using the thermosetting resin composition have excellent electrical insulating properties, heat resistance, and flame-retardancy.

EXAMPLE

Hereinafter, the present invention will be specifically described using Examples. Note that the present invention is not limited to the Examples described below.

Examples 1 to 8 and Comparative Examples 1 to 11

Preparation of Thermosetting Resin Composition

Each component used when a thermosetting resin composition is prepared in this example will be described.
(Benzoxazine Compound)
Bisphenol F-based benzoxazine compound: compound represented by Formula (1) above (available from Shikoku Chemicals Corporation)
(Thermosetting Compound Other than Benzoxazine Compound)
Epoxy resin: HP-9500 available from DIC Corporation (epoxy equivalent: 272 g/eq)
Phenol resin: TD-2090 available from DIC Corporation
Phosphorus-containing phenol resin: XZ-92741 available from The Dow Chemical Company
(Triazine Thiol Compound)
2,4,6-trimercapto-s-triazine: compound represented by Formula (2) above (Zisnet F available from Sankyo Kasei Co., Ltd., molecular weight: 177)
(Thiol Compound)
Thiol compound 1: 3-mercaptopropyltrimethoxysilane (available from Sankyo Kasei Co., Ltd.)
Thiol compound 2: pentaerythritol tetrakis(3-mercaptobutyrate) (Karenz MT PE1 available from Showa Denko K.K.)
Thiol compound 3: trimethylolpropane tris(3-mercaptobutyrate) (TPMB available from Showa Denko K.K.)

(Curing Accelerator Other than Triazine Thiol Compound)

Imidazole: 2-ethyl-4-methyimidazole (available from Shikoku Chemicals Corporation)

[Preparation Method]

First, the aforementioned components were added at a blend ratio shown in Tables 1 and 2 to a liquid mixture of 1-methoxy-2-propanol and THF so that the concentration of solid content was 20% by mass, and thereby the mixture was obtained. The mixture obtained in this manner was stirred at room temperature for 10 minutes to obtain a thermosetting resin composition.

[Evaluation]

(Measurement of Gel Time of Thermosetting Resin Composition)

The gel time of the thermosetting resin composition obtained in each Example and Comparative Example was measured at 170° C. and 200° C., conforming to JIS C 6521.

The results of evaluation tests are shown in Tables 1 and 2.

setting resin composition was heated at 200° C. was shorter than that in Comparative Examples 1 to 4 in which the triazine thiol compound was not blended and a phenol resin or a phosphorus-containing phenol resin was blended. Also, it can be understood also from a comparison between Example 5 and Comparative Example 5 or a comparison between Example 6 and Comparative Example 6 that in order to accelerate curing reaction of the benzoxazine compound, it is preferable that the triazine thiol compound be blended.

On the other hand, in the case where a thiol compound that does not have a triazine ring was blended (Comparative Examples 7 to 9), there was a tendency for the gel time to be longer compared to Examples 2 and 4 in which 0.5 to 1 part by mass of the triazine thiol compound was blended. Also, the gel time was long in the case where only the bisphenol F-based benzoxazine compound was blended (Comparative Example 10), and the case where only the triazine thiol compound was blended (Comparative Example 11), compared to Examples.

TABLE 1

| | | Example | | | | | | | |
|---|---|---|---|---|---|---|---|---|---|
| | | 1 | 2 | 3 | 4 | 5 | 6 | 7 | 8 |
| Composition (parts by mass) | bisphenol F-based benzoxazine compound | 10 | 10 | 10 | 10 | 10 | 10 | 10 | 10 |
| | epoxy resin | | | | | | | 5 | 5 |
| | phenol resin | | | | | | | | |
| | phosphorus-containing phenol resin | | | | | | | | |
| | triazine thiol compound | 1 | 1 | 0.5 | 0.5 | 0.1 | 0.1 | 1 | 1 |
| | thiol compound 1 | | | | | | | | |
| | thiol compound 2 | | | | | | | | |
| | thiol compound 3 | | | | | | | | |
| | imidazole | 0.1 | | 0.1 | | 0.1 | | 0.1 | |
| Evaluation | gel time (heated at 200° C.) | 42 sec | 50 sec | 2 min 2 sec | 2 min 35 sec | 5 min 45 sec | 6 min 50 sec | 10 sec | 30 sec |
| | gel time (heated at 170° C.) | | 2 min 40 sec | 7 min 2 sec | | | | 17 sec | 1 min 10 sec |

TABLE 2

| | | Comparative Example | | | | | | | | | | |
|---|---|---|---|---|---|---|---|---|---|---|---|
| | | 1 | 2 | 3 | 4 | 5 | 6 | 7 | 8 | 9 | 10 | 11 |
| Composition (parts by mass) | bisphenol F-based benzoxazine compound | 10 | 10 | 10 | 10 | 10 | 10 | 10 | 10 | 10 | 10 | |
| | epoxy resin | | | | | | | | | | | |
| | phenol resin | 1 | 1 | | | | | | | | | |
| | phosphorus-containing phenol resin | | | 1 | 2 | 2 | | | | | | |
| | triazine thiol compound | | | | | | | | | | | 1 |
| | thiol compound 1 | | | | | | | 1 | | | | |
| | thiol compound 2 | | | | | | | | 1 | | | |
| | thiol compound 3 | | | | | | | | | 1 | | |
| | imidazole | 0.1 | | | | 0.1 | 0.1 | | | | | |
| Evaluation | gel time (heated at 200° C.) | 2 min 46 sec | 4 min 22 sec | 9 min 28 sec | 8 min 24 sec | 7 min 50 sec | 11 min 30 sec | 8 min | 8 min 2 sec | 8 min 35 sec | 20 min or more | 20 min or more |
| | gel time (heated at 170° C.) | | | | | | | | | | | |

As shown in Tables 1 and 2, in the case where 0.5 to 1 part by mass of the triazine thiol compound was blended (Examples 1 to 4), the gel time in the case where the thermo- Also, it can be understood from a comparison between Example 1 and Example 7 or a comparison between Example 2 and Example 8 that if the benzoxazine compound and an epoxy resin are used in combination, a more preferable curing acceleration effect can be obtained.

Based on the results above, it can be understood that if the curing accelerator containing the triazine thiol compound is used for the thermosetting resin containing the benzoxazine compound, an excellent curing acceleration effect can be obtained. Moreover, according to these results, it is conceivable that the present invention is widely applicable to various cases in which the thermosetting resin composition containing the benzoxazine compound is used.

Note that although the aforementioned Examples describe cases in which the bisphenol F-based benzoxazine compound, which is an Fa-based benzoxazine compound, is used as the benzoxazine compound, the present invention is not limited to this. For example, a Pd-based benzoxazine compound may be used as the benzoxazine compound.

The invention claimed is:

1. A method of curing a thermosetting resin composition, comprising:
    preparing a thermosetting resin composition comprising a thermosetting resin containing a benzoxazine compound and a curing accelerator containing a triazine thiol compound; and
    heating the thermosetting resin composition to be cured, wherein the thermosetting resin contains 0.4 or less equivalents of an epoxy resin relative to one equivalent of the benzoxazine compound.

2. The method of curing the thermosetting resin composition according to claim 1, wherein
    the thermosetting resin composition is heated to 50° C. or more to be cured.

3. The method of curing the thermosetting resin composition according to claim 1, wherein
    the triazine thiol compound includes a compound having three or more thiol groups in one molecule.

4. The method of curing the thermosetting resin composition according to claim 1, wherein
    the triazine thiol compound includes a compound having a triazine ring and a thiol group directly bound to the triazine ring.

5. The method of curing the thermosetting resin composition according claim 1, wherein
    a percentage of the triazine thiol compound to an entirety of the thermosetting resin composition is within a range of 0.1 to 30% by mass.

6. The method of curing the thermosetting resin composition according to claim 1, wherein
    the curing accelerator further includes imidazole.

7. The method of curing the thermosetting resin composition according to claim 1, wherein
    the thermosetting resin further includes an epoxy resin.

* * * * *